(12) United States Patent
Tseng et al.

(10) Patent No.: US 11,658,044 B2
(45) Date of Patent: May 23, 2023

(54) THERMALLY CONDUCTIVE STRUCTURE FOR HEAT DISSIPATION IN SEMICONDUCTOR PACKAGES

(71) Applicant: Taiwan Semiconductor Manufacturing Co., Ltd., Hsin-Chu (TW)

(72) Inventors: Chun-Hao Tseng, Taichung (TW); Ying-Hao Kuo, Hsinchu (TW); Kuo-Chung Yee, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 93 days.

(21) Appl. No.: 17/205,146

(22) Filed: Mar. 18, 2021

(65) Prior Publication Data

US 2021/0202270 A1    Jul. 1, 2021

Related U.S. Application Data

(60) Continuation of application No. 16/575,698, filed on Sep. 19, 2019, now Pat. No. 10,957,559, which is a
(Continued)

(51) Int. Cl.
*H01L 21/48* (2006.01)
*H01L 23/00* (2006.01)
(Continued)

(52) U.S. Cl.
CPC ...... *H01L 21/4871* (2013.01); *H01L 21/4878* (2013.01); *H01L 21/565* (2013.01);
(Continued)

(58) Field of Classification Search
CPC ................ H01L 24/32; H01L 21/4878; H01L 21/565; H01L 23/3736; H01L 24/29;
(Continued)

(56) References Cited

U.S. PATENT DOCUMENTS 4,974,057 A * 11/1990 Tazima .................. H05K 1/181
257/737
5,054,193 A * 10/1991 Ohms .................. H05K 3/3415
29/760
(Continued)

OTHER PUBLICATIONS

Non-Final Office Action dated Jul. 17, 2015 for U.S. Appl. No. 14/075,139.
(Continued)

*Primary Examiner* — Mouloucoulaye Inoussa
(74) *Attorney, Agent, or Firm* — Eschweiler & Potashnik, LLC

(57) ABSTRACT

A semiconductor package includes a wafer and at least one chip attached on first portions of an upper surface of the wafer. Further, the semiconductor package includes an insulating barrier layer, a thermally conductive layer, and a heat sink. The insulating barrier layer is arranged over the at least one chip attached on first portions of an upper surface of the wafer. The thermally conductive layer is arranged over the insulating barrier layer and at least partially encapsulates the at least one chip. The heat sink is arranged over the thermally conductive layer.

20 Claims, 3 Drawing Sheets

Related U.S. Application Data division of application No. 15/418,949, filed on Jan. 30, 2017, now Pat. No. 10,541,154, which is a division of application No. 14/075,139, filed on Nov. 8, 2013, now Pat. No. 9,576,930.

(51) Int. Cl.
| | | |
|---|---|---|
| *H01L 23/36* | (2006.01) | |
| *H01L 23/373* | (2006.01) | |
| *H01L 23/31* | (2006.01) | |
| *H01L 21/56* | (2006.01) | |
| *H01L 25/065* | (2006.01) | |
| *H01L 25/00* | (2006.01) | |

(52) U.S. Cl.
CPC ...... *H01L 23/3121* (2013.01); *H01L 23/3135* (2013.01); *H01L 23/36* (2013.01); *H01L 23/3736* (2013.01); *H01L 23/3737* (2013.01); *H01L 24/29* (2013.01); *H01L 24/32* (2013.01); *H01L 24/83* (2013.01); *H01L 25/0652* (2013.01); *H01L 25/50* (2013.01); *H01L 2224/2919* (2013.01); *H01L 2224/32225* (2013.01); *H01L 2224/83101* (2013.01); *H01L 2924/181* (2013.01); *H01L 2924/3511* (2013.01)

(58) Field of Classification Search
CPC . H01L 23/3121; H01L 23/36; H01L 23/3737; H01L 24/83; H01L 21/4871; H01L 23/3135; H01L 25/0652; H01L 25/50; H01L 23/3675; H01L 25/16; H01L 23/64; H01L 23/3677; H01L 25/0655; H01L 21/4882; H01L 21/52; H01L 23/562; H01L 23/053; H01L 21/563; H01L 23/42; H01L 21/4803; H01L 24/97; H01L 23/10; H01L 23/49827; H01L 23/49822; H01L 25/0657; H01L 23/04; H01L 24/13; H01L 23/5389
USPC ....... 257/675, 706, 796, 707, 723, 713, 724, 257/790, 687, 669, 717, 778, 712, 729, 257/690, 691, 693, 414, 783, 532, 698, 257/666, E23.051, E33.075; 438/122, 438/123, 124, 125, 118, 121, 126, 127, 438/107, 462, 584, 54, 48, 106, 119, 687; 361/720, 708, 709, 719, 707, 705, 710, 361/718
See application file for complete search history.

(56) References Cited

U.S. PATENT DOCUMENTS

| | | | |
|---|---|---|---|
| 5,552,635 A | 9/1996 | Kim et al. | |
| 6,035,524 A * | 3/2000 | Suppa ................. | G05B 19/4207 174/16.3 |
| 6,319,740 B1* | 11/2001 | Heffner .................. | H01L 23/24 257/E23.121 |
| 8,564,114 B1* | 10/2013 | Lanzone ................ | H01L 23/42 257/276 |
| 2002/0008963 A1* | 1/2002 | DiBene, II ............. | H05K 3/368 361/720 |
| 2002/0012762 A1 | 1/2002 | Bunyan et al. | |
| 2005/0068739 A1* | 3/2005 | Arvelo ................ | H01L 23/3675 257/E23.09 |
| 2005/0110140 A1 | 5/2005 | Kuo | |
| 2006/0171121 A1* | 8/2006 | Bell .................. | H05K 7/20509 361/704 |
| 2007/0045829 A1 | 3/2007 | Jeong | |
| 2007/0080458 A1* | 4/2007 | Ogawa ................... | H01L 24/82 257/E23.008 |
| 2007/0177356 A1* | 8/2007 | Panek ................... | H01L 23/433 257/E23.125 |
| 2008/0142946 A1* | 6/2008 | Yang .................. | H01L 23/3128 438/118 |
| 2008/0265383 A1* | 10/2008 | Brunnbauer ........ | H01L 23/3128 438/114 |
| 2008/0265421 A1 | 10/2008 | Brunnbauer | |
| 2009/0061238 A1* | 3/2009 | Huffstutler ............. | H05K 3/284 428/446 |
| 2009/0108440 A1* | 4/2009 | Meyer .................... | H01L 24/97 257/723 |
| 2009/0166849 A1* | 7/2009 | Jao ....................... | H01L 23/4334 257/E21.507 |
| 2009/0242916 A1 | 10/2009 | Hsu | |
| 2009/0267222 A1 | 10/2009 | Zhong et al. | |
| 2010/0020497 A1* | 1/2010 | Hayakawa ......... | H05K 7/20463 361/705 |
| 2010/0044841 A1 | 2/2010 | Mahler et al. | |
| 2010/0155925 A1* | 6/2010 | Kunimoto ........... | H01L 23/5389 257/690 |
| 2010/0187678 A1 | 7/2010 | Kajiwara et al. | |
| 2010/0193932 A1 | 8/2010 | Kang | |
| 2011/0228485 A1* | 9/2011 | Usui ................... | H05K 7/20509 361/720 |
| 2012/0028411 A1 | 2/2012 | Yu | |
| 2012/0129300 A1* | 5/2012 | Lin ..................... | H01L 23/5389 438/122 |
| 2012/0280382 A1* | 11/2012 | Im ....................... | H01L 23/3128 257/E23.11 |
| 2013/0032387 A1* | 2/2013 | Haba .................... | H01L 21/561 174/260 |
| 2013/0071617 A1 | 3/2013 | Sjolen | |
| 2013/0075932 A1* | 3/2013 | Schwarzer .......... | H01L 23/5226 257/774 |
| 2013/0258599 A1* | 10/2013 | Danello ................ | H01L 23/433 361/706 |
| 2014/0217575 A1* | 8/2014 | Hung .................... | H01L 23/373 257/713 |
| 2014/0252634 A1* | 9/2014 | Hung .................. | H01L 21/4803 257/773 |
| 2014/0264799 A1* | 9/2014 | Gowda ............ | H01L 23/49568 438/122 |
| 2014/0264800 A1 | 9/2014 | Gowda et al. | |
| 2014/0264821 A1* | 9/2014 | Tang ........................ | B29C 39/10 257/713 |
| 2015/0048922 A1* | 2/2015 | Kimura ............... | H01M 50/581 337/401 |

OTHER PUBLICATIONS

Final Office Action dated Dec. 31, 2015 for U.S. Appl. No. 14/075,139.
Non-Final Office Action dated Jun. 3, 2016 for U.S. Appl. No. 14/075,139.
Notice of Allowance dated Oct. 7, 2016 for U.S. Appl. No. 14/075,139.
Non-Final Office Action dated Nov. 1, 2017 for U.S. Appl. No. 15/418,949.
Non-Final Office Action dated Apr. 16, 2018 for U.S. Appl. No. 15/418,949.
Non-Final Office Action dated Feb. 25, 2019 for U.S. Appl. No. 15/418,949.
Final Office Action dated Oct. 30, 2018 for U.S. Appl. No. 15/418,949.
Final Office Action dated Jul. 18, 2019 for U.S. Appl. No. 15/418,949.
Notice of Allowance dated Oct. 17, 2019 for U.S. Appl. No. 15/418,949.
Non-Final Office Action dated Apr. 17, 2020 for U.S. Appl. No. 16/575,698.
Final Office Action dated Aug. 25, 2020 for U.S. Appl. No. 16/575,698.
Notice of Allowance dated Nov. 13, 2020 for U.S. Appl. No. 16/575,698.

* cited by examiner

THERMALLY CONDUCTIVE STRUCTURE FOR HEAT DISSIPATION IN SEMICONDUCTOR PACKAGES

REFERENCE TO RELATED APPLICATIONS

This application is a Continuation of U.S. application Ser. No. 16/575,698, filed on Sep. 19, 2019, which is a Divisional of U.S. application Ser. No. 15/418,949, filed on Jan. 30, 2017 (now U.S. Pat. No. 10,541,154, issued on Jan. 21, 2020), which is a Divisional of U.S. application Ser. No. 14/075,139, filed on Nov. 8, 2013 (now U.S. Pat. No. 9,576,930, issued on Feb. 21, 2017). The contents of the above-referenced patent applications are hereby incorporated by reference in their entirety.

BACKGROUND

Poor heat dissipation is a common issue for microelectronics device packages. Semiconductor chips can have localized overheating that can be deleterious to product yield, performance and reliability of the resulting microelectronics device packages. A thermal management device such as a heat sink is typically placed on the backside of wafers for heat dissipation to be transported through a molding compound encapsulating a surface of the wafer to the ambient. However, the molding compound typically a mixture of an epoxy and a silica filler, has a low thermal conductivity that is generally in the range of 0.6 W/m-K to 0.8 W/m-K. This can make the molding compound a barrier to heat dissipation.

For processes where the thermal management device is attached to the wafer, a back-side grinding process is needed to reduce the thickness of the molding compound. However, such grinding process may cause the molding compound to become undone or delaminated from the wafer to which it is attached to. Where this has occurred, the edges of chips of the wafer may be susceptible to cracking and chipping and/or exposed to corrosive environmental influences during a subsequent dicing process and associated handling.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
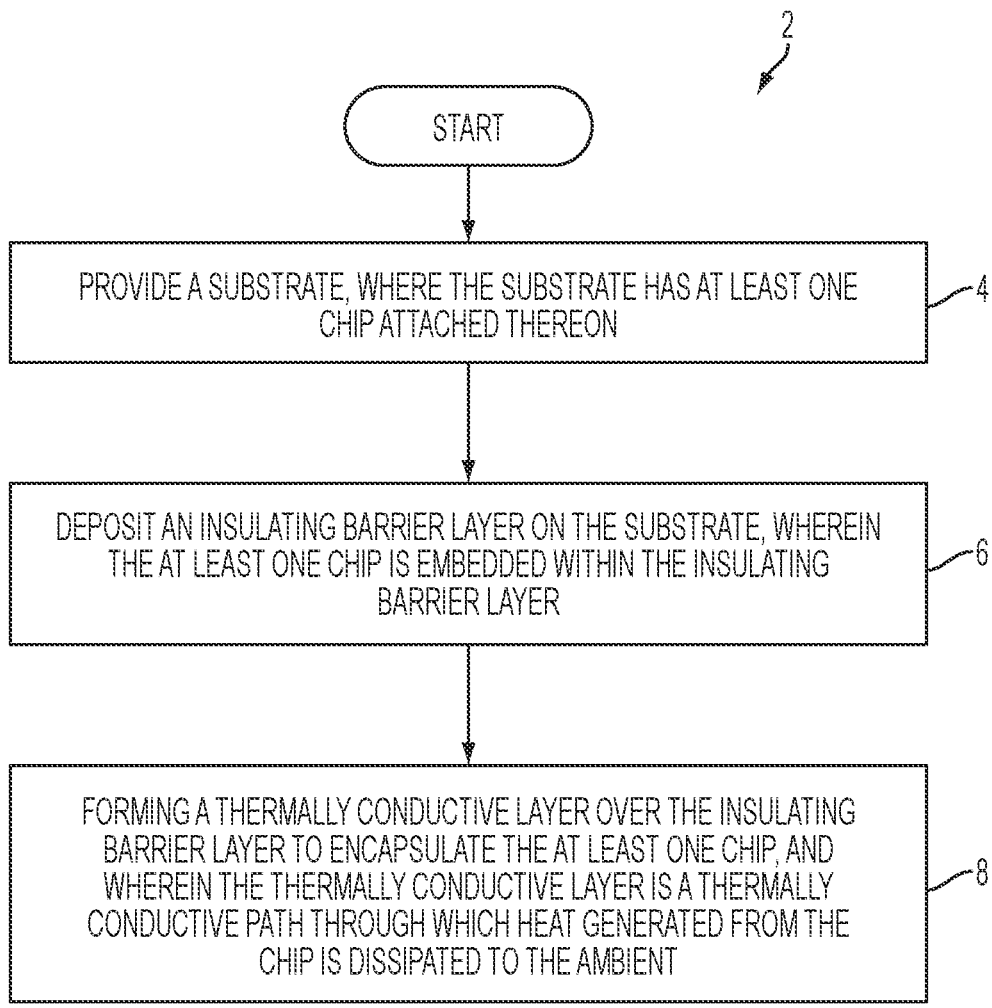
FIG. 1 is a flowchart of a method of fabricating a semiconductor package according to one embodiment of the present disclosure.

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

This description of the various embodiments is intended to be read in connection with the accompanying drawings, which are to be considered part of the entire written description. In the description, relative terms such as "before," "after," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the system be constructed or operated in a particular orientation. Terms concerning attachments, coupling and the like, such as "connected" and "interconnected," refer to a relationship wherein components are attached to one another either directly or indirectly through intervening components, unless expressly described otherwise.

FIG. 1 is a flowchart of a method 2 for fabricating a semiconductor package according to various aspects of the present disclosure. Referring to FIG. 1, the method 2 includes block 4, in which a substrate is provided, the substrate having at least one chip attached thereon. The method 2 includes block 6, in which an insulating barrier layer is deposited on the substrate and the at least one chip is embedded within the insulating barrier layer. The method 2 includes block 8, in which a thermally conductive layer is formed over the insulating barrier layer to encapsulate the at least one chip. In some embodiments, the thermally conductive layer is a thermally conductive path through which heat that is generated from the chip is dissipated to the ambient.

One of ordinary skill in the art would recognize that an order of operations in method 2 is adjustable. One of ordinary skill in the art would further recognize that additional steps are able to be included in method 2 without departing from the scope of this description.

FIGS. 2-4b are cross-sectional views of a semiconductor package 100 at various stages of fabrication according to various embodiments of the present disclosure. It is understood that FIGS. 2-4b have been simplified for a better illustration of the concepts of the present disclosure. It should be appreciated that the materials, geometries, dimensions, structures, and process parameters described herein are only illustrative, and are not intended to be, and should not be construed to be, limiting to the present disclosure. Many alternatives and modifications will be apparent to those skilled in the art, once informed by the present disclosure.

Figure 2:
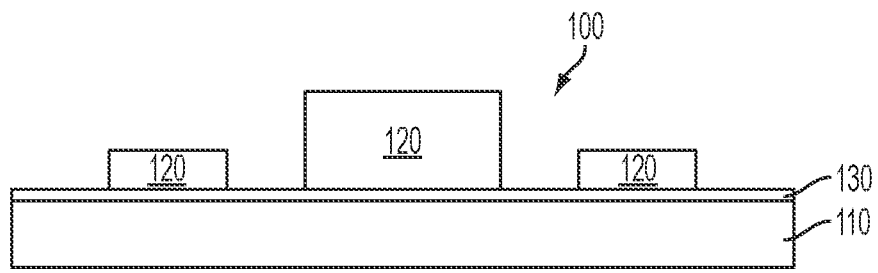
FIGS. 2, 3A, and 4A are cross-sectional views of a portion of a semiconductor package at various stages of fabrication according to one or more embodiments of the present disclosure.

Referring to FIG. 2, a substrate 110 is provided. In some embodiments, the substrate 110 is a wafer carrier, and hence is alternatively referred to as wafer carrier 110 hereinafter. The wafer carrier 110 has chips 120 attached to a surface thereto by an adhesive layer 130. In some embodiments, wafer carrier 110 has chips 120 attached to an upper surface of the wafer carrier 110 by an adhesive layer 130. Wafer carrier 110 facilitates wafer handling, transport, and processing. Wafer carrier 110 can be a silicon substrate, glass substrate, polymer substrate, polymer-based composite substrate, or thick tape. In some embodiments, wafer carrier 110 is rigid to reduce wafer warping and prevents wafer breakage that may occur during handling and processing.

Referring to FIG. 2, a substrate 110 is provided. In some embodiments, the substrate 110 is a wafer carrier, and hence is alternatively referred to as wafer carrier 110 hereinafter. The wafer carrier 110 has chips 120 attached to a surface thereto by an adhesive layer 130. In some embodiments, wafer carrier 110 has chips 120 attached to an upper surface of the wafer carrier 110 by an adhesive layer 130. Wafer carrier 110 facilitates wafer handling, transport, and processing. Wafer carrier 110 can be a silicon substrate, glass substrate, polymer substrate, polymer-based composite substrate, or thick tape. In some embodiments, wafer carrier 110 is rigid to reduce wafer warping and prevents wafer breakage that may occur during handling and processing.

In some embodiments, chips 120 comprise memory chips, logic chips, processor chips, and/or the like. Chips 120 are attached to a surface of wafer carrier 110 by adhesive layer 130 and may be attached thereto by, for example adhesive bonding, tape bonding, or resin bonding.

Figure 3A:
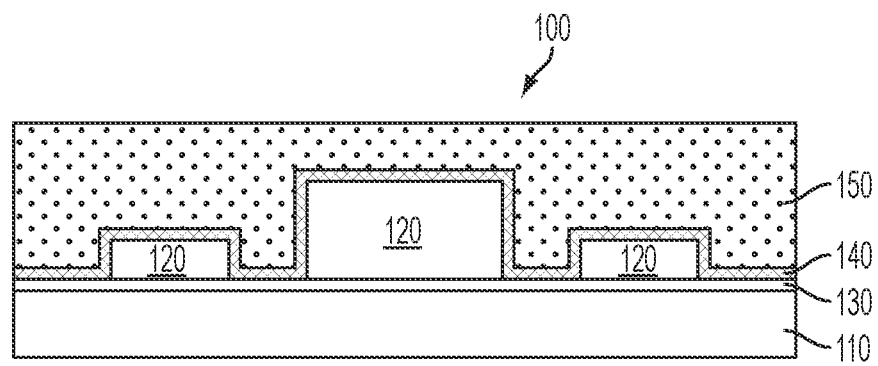

Referring now to FIG. 3a, an insulating barrier layer 140 is deposited on the adhesive layer 130 and chips 120 to embed chips 120 thereunder. In some embodiments, insulating barrier layer 140 is deposited on the adhesive layer 130 and to partially embed chips 120. The insulating barrier layer 140 protects against short circuits that may occur from a later to be deposited thermal conductive layer 150 by sealing and insulating the chips 120 from the thermal conductive layer 150. In some embodiments, the insulating barrier layer 140 comprises a single layer or a plurality of layers. In some embodiments, the insulating barrier layer 140 includes a dielectric material, polymers, polyimide, oxides, silicon nitride ($SiN_x$), silicon oxynitride ($SiON_x$), silicon oxide ($SiO_x$), tantalum, (Ta), tantalum nitride (TaN), titanium (Ti), titanium nitride (TiN), carbides, SOG, BCB, PBO, TEOS, combinations of these, or other suitable materials that have good electrical insulating properties. In some embodiments, the insulating barrier layer 140 is formed using a deposition process such as chemical vapor deposition (CVD), plasma-enhanced CVD (PECVD), low pressure chemical vapor deposition (LPCVD), physical vapor deposition (PVD), atomic layer deposition (ALD), spin-on coating, lamination, or other suitable processes. In one embodiment, the insulating barrier layer 140 is conformally deposited to a thickness ranging from about 10 Angstroms to about 100,000 Angstroms.

With reference still to FIG. 3a, a thermal conductive layer 150 is deposited over the insulating barrier layer 140 and completely encapsulates chips 120. In some embodiments, thermal conductive layer 150 is deposited over the insulating barrier layer 140 and partially encapsulates chips 120. The thermal conductive layer 150 provides a high degree of heat dissipation by providing a thermal path through which thermal energy, or heat, generated from chips 120 is dissipated to the ambient or environment. The higher thermal conductivity of the thermal conductive layer 150 functions as an integrated heat spreader to dissipate heat from the chips 120. The thermal conductive layer 150 may be used in any integrated circuit packaging type, including but not limited to wire bonded packages, flip chip molded matrix arrays packages (FCMMAP), and other packages that couple an integrated circuit die to second level interconnects such as a ball grid array, a land grid array, and/or a pin grid array. The thermal conductive layer 150 may be used with any integrated circuit packaging technology.

In accordance with various embodiments of the present disclosure, the thermal conductive layer 150 provides sufficient passive cooling for the integrated circuit package. For instance, in some embodiments of the present disclosure, the thermal conductive layer 150 has a thermal conductivity ranging from about 3 W/m-K to about 10 W/m-K. In some embodiments, the thermal conductivity of the thermal conductive layer 150 is higher than 10 W/m-K, depending on the specific materials used in the thermal conductive layer 150, as described below.

In one embodiment, the thermal conductive layer 150 is a metal, such as copper, copper alloy, aluminum, gold or other suitable metals deposited on substrate 110 by an electrochemical plating (ECP) process or a sputtering technique. In an ECP process, the thermal conductive layer 150 is blanket deposited on the insulating barrier layer 140. The thickness of the thermal conductive layer 150 ranges from about 0.5 microns to about 300 microns, depending on chip spacing and any other variables. In some embodiments, an optional copper seed layer is first formed on the insulating barrier layer 140 upon which the thermal conductive layer 150 is then formed on. In some embodiments, an ECP process involves an electroplating composition having a current density of about 3-60 $A/cm^2$. In some embodiments, the plating bath can include $CuSO_4$, HCl, $H_2SO_4$, suppressor(s) and additives. In one embodiment, the ECP solution is maintained at a temperature within the range of about 20-40 degrees Celsius and a pH in the range of about 1-7. In some embodiments, the current density of the ECP solution is within the range from about 3 to about 60 $aA/cm^2$. In some embodiments, the ECP process is continued for a duration of time until the top surface of the chips 120 are completely covered with the thermal conductive layer 150. In some embodiments, the ECP process is continued for a duration of time until the surface of the chips 120 is partially covered with the thermal conductive layer 150. One skilled in the art understands that the duration and the intensity of the ECP process can be adjusted according to the desired outcome.

In some embodiments, a copper sputtering process is used to deposit the thermal conductive layer 150. Copper sputtering is also known as physical vapor deposition (PVD). Although a PVD method has one advantage of forming a copper or copper alloy layer without introducing impurities, PVD typically has a lower deposition rate than an ECP process.

In some embodiments, following copper ECP deposition, a planarization process, for example CMP, is carried out to planarize a surface of the thermal conductive layer 150 to receive a heat sink. In some embodiments, the thermal conductive layer 150 is deposited by chemical vapor deposition (CVD), plasma-enhanced CVD (PECVD), atomic layer deposition (ALD), evaporation, and/or other suitable processes.

In another embodiment, the thermal conductive layer 150 includes a thermally conductive adhesive layer. In some embodiments, the thermally conductive adhesive layer includes a conductive filler material such as silver (Ag), copper (Cu), gold (Au), aluminum (Al), solder, carbon related materials such as carbon nanotubes, graphite, combinations of these or other conductive materials. The use of a thermally conductive filler material substantially increases the overall thermal conductivity of the adhesive layer. As an example, carbon nanotubes used in connection with an adhesive tape type material can be arranged in the tape using a variety of approaches. In some embodiments, carbon nanotubes are grown in a generally vertical direction from a material used in the tape. Catalyst material is arranged where growth is desirable, and a carbon-containing gas is introduced to the catalyst material. Carbon nanotubes are grown extending generally away from the catalyst material. After growth, the area around the carbon nanotubes is filled with base material including, for example, one or more adhesives, compliant plastics, and insulative material. Surfaces of the tape are arranged with an adhesive, using for example, an adhesive base material and/or adding an adhesive material at the surface.

The thermally conductive adhesive layer can use a variety of adhesives. In some embodiments, where the tape type material is implemented with a flexible tape type material, the base material of the thermal conductive layer 150 is a generally flexible material. In some embodiments, where the tape type material is implemented with uneven surfaces of integrated circuit components, such as chips 120 having differing heights shown in FIG. 3a, or where a pliable material is otherwise desired, the base material is a conforming material adapted to push or squeeze around and/or in surface configurations of the integrated circuit components. With these and other approaches, materials used for the base material may include one or more of: plastics, adhesives, glues, epoxies, polymers, thermoplastics, silicone, grease, oil, and resin.

The thermally conductive adhesive layer can be deposited on the insulating barrier layer 140 by a dispense process or a blade process. In a dispense process according to one embodiment of the present disclosure, a material of the thermally conductive adhesive layer is dissolved in a solvent such as, for example IPA, acetone, NMP, or otherwise melted to obtain a viscosity in the range from about 1,000 cps to about 10,000 cps. The liquid or melted conductive adhesive material is placed in a container, such as a syringe which is then squeezed out onto the semiconductor package 100 by applying a pushing pressure of about 10 psi to about 500 ps. The thermally conductive adhesive material is thereafter subject to a thermal baking process having a temperature of about 100 C to about 150 C to remove residue solvent and solidify the thermally conductive adhesive layer on the insulating barrier layer 140.

In a blade process, according to one embodiment of the present disclosure, a material of the thermally conductive adhesive layer is dissolved in a solvent such as, for example IPA, acetone, NMP or other suitable solvent that provides good solubility to obtain a viscosity in the range from about 1,000 cps to about 10,000 cps. The liquid or melted conductive adhesive material is placed in a container that combines with a roller and a solid or flexible metal sheet, for example. Through a rolling process, the roller lays out the melted conductive adhesive material onto a surface of the insulating barrier layer 140. Thereafter, the solid or flexible metal sheet functions as a blade to remove excess layers from the thermally conductive adhesive layer so that a surface of the thermally conductive adhesive layer is higher than chips 120.

In yet another embodiment, the thermal conductive layer 150 is a polymer material having a conductive filler material. Unlike conventional polymer material, the use of a thermally conductive filler material substantially increases the overall thermal conductivity of the polymer material. In one embodiment, the thermally conductive filler material is alumina. Alumina has a thermal conductivity that is approximately 30 W/m-K. In some embodiments, the weight percentage of alumina in the polymer material ranges from 30% to 99%. In some embodiments, the weight percentage of alumina in the polymer material ranges from 70% to 95%. In some embodiments, using alumina as the filler material increases the overall thermal conductivity of the thermal conductive layer 150 to a value that falls within the range provided above (i.e., 3 W/m-K to 10 W/m-K) yielding a substantial improvement over the range of 0.6 W/m-K to 0.8 W/m-K thermal conductivity of conventional polymers.

In some embodiments, alternate filler materials with a high thermal conductivity are used in the polymer material instead of alumina. For example, in some embodiments, aluminum nitride having a thermal conductivity of approximately 180 W/m-K is used. In other embodiments, beryllium oxide having a thermal conductivity of approximately 260 W/m-K is used. Metallic solids such as aluminum (Al), copper (Cu), silver (Ag), gold (Au), AlN, $Al_2O_3$, combinations thereof, or suitable metal and non-metallic solids such as diamond, silicon, and silicon carbide may also be used. In some embodiments, the filler material includes a solder material such as tin, lead, copper, antimony, silver, combinations of these, or other suitable solder material. In some embodiments, the filler material includes carbon nanotubes, graphite, or the like. In some embodiments, a combination of two or more of the above described filler materials is used, such as a combination of two or more of alumina, aluminum nitride, beryllium oxide, and carbon nanotubes.

One skilled in the art understands that alternate filler materials having high thermal conductivities that are not specifically listed here may be used in accordance with implementations of the present disclosure provided the alternate filler materials are compatible with the polymer material. In some embodiments, the weight percentage of the filler material in the polymer material ranges from approximately 30% to 99%. In some embodiments, the weight percentage of the filler material in the polymer material ranges from approximately 70% to 95%.

In some embodiments, a polymer material of the thermal conductive layer 150 is formed by a molding process. In some embodiments of the molding process, a polymer material in a liquid or sheet form is dispensed or laminated on top of insulating barrier layer 140. To prevent bubbles from forming in a subsequent compression process, the polymer material may be subject to a vacuum process where a vacuum is pumped down to a value of about 0.01 to about 10 Torr. Then in the compression process, the polymer material is subject to a compression force of about 1 kg/cm² to about 10 kg/cm² for a time of about 1 to 30 minutes at a temperature from about 50 C to about 200 C. After the compression process, a post mold cure (PMC) process is applied to fully cure the polymer material to achieve better mechanical property. In the PMC process, the polymer material is subject to a hot plate or oven, for example at a temperature of about 100 C to about 200 C and for a process time of about 0.1 hour to about 20 hours. Once the molding process is completed, the polymer material forms thermal conductive layer 150 that uniformly covers insulating barrier layer 140.

Figure 4A:
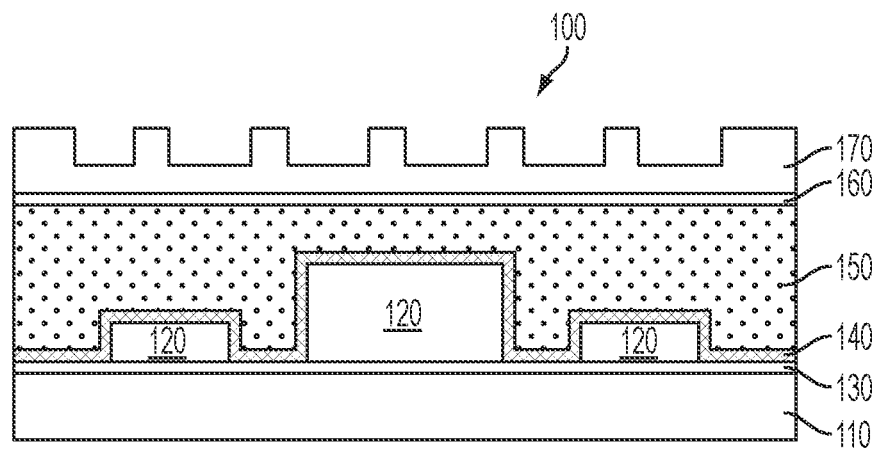

Referring now to FIG. 4a, a thermal interface material (TIM) 160 is dispensed on the top surface of the thermal conductive layer 150. In some embodiments, TIM 160 is a thermally conductive and electrically insulative material, such as an epoxy, for example an epoxy mixed with a metal, including silver or gold, a "thermal grease," a "white grease," or the like, or a combination thereof. A thermal management device 170 including a heat sink is thereafter placed on the TIM 160 to facilitate the dissipation of heat from chips 120.

Figure 3B:
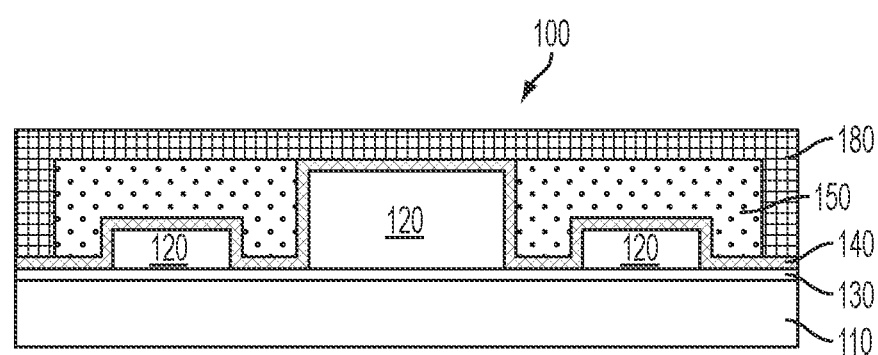
FIGS. 3B and 4B are cross-sectional views of a portion of a semiconductor package at various stages of fabrication according to one or more embodiments of the present disclosure.
Figure 4B:
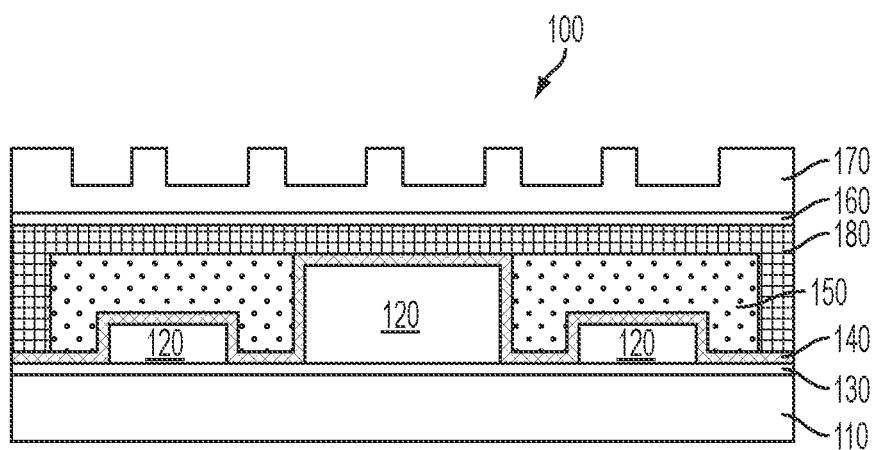

FIGS. 2, 3b, and 4b are cross-sectional views of a portion of a semiconductor package at various stages of fabrication according to some embodiments of the present disclosure. In some embodiments, a molding compound can be used in conjunction with the thermal conductive layer 150 whereby the molding compound is dispensed on the thermal conductive layer 150. Referring back to FIG. 3a, after forming the thermal conductive layer 150 over substrate 110, the thermal conductive layer 150 is planarized, by a chemical mechanical polishing (CMP) process, for example to remove a portion of the thermal conductive layer 150 above the insulating barrier layer 140 thereby exposing a surface of insulating barrier layer 140, as shown in FIG. 3b. In some embodiments, wet chemical etching, dry chemical etching, dry polishing, plasma etching, or other suitable etching processes are utilized to remove a portion of the thermal conductive layer 150 above the insulating barrier layer 140, thereby exposing a surface of insulating barrier layer 140, as shown in FIG. 3b.

After the planarization step is completed, a molding compound 180 is formed over the thermal conductive layer 150 and the exposed surface of the insulating barrier layer 140. The molding compound functions to provide package stiffness, provide a protective or hermetic cover, provide shielding, and/or provide a heat conductive path. In some embodiments, molding compound 180 includes a material such as epoxy, epoxy with thermally conductive filler materials, organic cylinders, plastic molding compound, plastic molding compound with fiber, etc. Molding compound 180 can be formed by a spin-on coating process, an injection molding process, and/or the like.

Referring now to FIG. 4b, a TIM 160 is dispensed on the top surface of the molding compound 180. In some embodiments, TIM 160 is a thermally conductive and electrically insulative material, such as an epoxy, like an epoxy mixed with a metal, including silver or gold, a "thermal grease," a "white grease," the like, or a combination thereof. A thermal management device 170 including a heat sink is thereafter placed on the TIM 160 to facilitate the dissipation of heat from chips 120.

Advantages of one or more embodiments of the present disclosure may include one or more of the following.

In one or more embodiments, by using a thermal conductive layer 150 as opposed to a molding compound, heat conductivity is increased and heat generated by a semiconductor chip is more efficiently dissipated externally.

In one or more embodiments, by using an insulating barrier layer 140 the thermal conductive layer 150 more efficiently dissipates heat than using a molding compound alone. Any thermal resistance caused by the molding compound is now eliminated.

In one or more embodiments, the thermal conductive layer 150 can function as a molding compound directly.

The present disclosure has described various embodiments.

According to one embodiment, a method of forming a semiconductor package includes providing a substrate, wherein the substrate has at least one chip attached to an upper surface of the substrate. An insulating barrier layer is deposited above the substrate, wherein the at least one chip is at least partially embedded within the insulating barrier layer. A thermally conductive layer is formed over the insulating barrier layer to at least partially encapsulate the at least one chip. The thermally conductive layer provides a thermally conductive path through which heat generated from the chip is dissipated to the ambient.

According to another embodiment, a semiconductor package includes a wafer carrier having at least one chip attached to an upper surface of the wafer carrier; an insulating barrier layer formed over the at least one chip; and a thermally conductive layer formed at least partially over the insulating barrier layer. The thermally conductive layer at least partially encapsulates the chip and provides a thermally conductive path through which heat generated from the chip is dissipated to the ambient.

In the preceding detailed description, various embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A semiconductor package, comprising:
   a wafer;
   at least one chip attached on first portions of an upper surface of the wafer;
   an insulating barrier layer arranged over the at least one chip, the insulating barrier layer extending from over the at least one chip continuously over second portions of the upper surface of the wafer to an outer edge of the wafer;
   a thermally conductive layer arranged over the insulating barrier layer, the thermally conductive layer at least partially encapsulating the at least one chip; and
   a heat sink arranged over the thermally conductive layer, the heat sink having an outermost sidewall that is aligned with an outer sidewall of the insulating barrier layer at the outer edge of the wafer.

2. The semiconductor package of claim 1, wherein the second portions of the upper surface of the wafer are continuously connected to the first portions of the upper surface of the wafer.

3. The semiconductor package of claim 1, further comprising:
   a thermal insulating material arranged between the thermally conductive layer and the heat sink.

4. The semiconductor package of claim 1, wherein the thermally conductive layer is arranged directly over the at least one chip and is arranged along outer sidewalls of the at least one chip.

5. The semiconductor package of claim 1, wherein the insulating barrier layer comprises a bottommost surface arranged below a topmost surface of the at least one chip.

6. The semiconductor package of claim 1, wherein the at least one chip includes a first chip having a first chip height and a second chip having a second chip height different than the first chip height, wherein the first and second chip heights are measured perpendicular to the upper surface of the wafer.

7. The semiconductor package of claim 6 further comprising:
   an adhesive layer arranged on the wafer, directly between the first chip and the wafer, and directly between the second chip and the wafer.

8. A semiconductor package, comprising:
a wafer;
a first chip and a second chip attached to an upper surface of the wafer, wherein an upper surface of the first chip is arranged at a first height measured perpendicularly from the upper surface of the wafer, wherein an upper surface of the second chip is arranged at a second height measured perpendicularly from the upper surface of the wafer, and wherein the first height is different than the second height;
an insulating barrier layer arranged over the wafer, above the upper surface of the first chip, along outer sidewalls of the first chip, above the upper surface of the second chip, and along sidewalls of the second chip;
a thermally conductive layer arranged over the insulating barrier layer;
a molding compound arranged over the thermally conductive layer, wherein the molding compound has thermal conductivity ranging from 0.6 W/m-K to 0.8 W/m-K, has a composition that differs from a composition of the thermally conductive layer, and contacts the insulating barrier layer over the first chip; and
a heat sink arranged over the thermally conductive layer.

9. The semiconductor package of claim 8, wherein the thermally conductive layer has a planar upper surface that extends over an entirety of the upper surface of the wafer.

10. The semiconductor package of claim 8, wherein the thermally conductive layer has a first thickness over the first chip and a second thickness over the second chip, wherein the first and second thicknesses are measured perpendicular to the upper surface of the wafer, and wherein the first thickness is different than the second thickness.

11. The semiconductor package of claim 8, wherein a topmost surface of the insulating barrier layer is substantially coplanar with a topmost surface of the thermally conductive layer.

12. The semiconductor package of claim 8, wherein the first chip is spaced apart from the second chip over the wafer by a portion of the wafer, and wherein the insulating barrier layer extends between the first chip and the second chip and over the portion of the wafer.

13. The semiconductor package of claim 8, further comprising:
a thermal insulating material arranged between the thermally conductive layer and the heat sink.

14. The semiconductor package of claim 8 further comprising:
an adhesive layer arranged on the wafer, directly between the first chip and the wafer, and directly between the second chip and the wafer.

15. A semiconductor package, comprising:
a wafer having an adhesive layer on an upper surface of the wafer;
at least one chip attached on first portions of an upper surface of the adhesive layer;
an insulating barrier layer arranged over the at least one chip and directly on a second portion of the upper surface of the adhesive layer;
a thermally conductive layer arranged over the insulating barrier layer, arranged over the at least one chip, and having a substantially planar upper surface;
a molding compound extending along outer sidewalls of the thermally conductive layer, wherein the molding compound has a composition that differs from a composition of the thermally conductive layer; and
a heat sink arranged over the thermally conductive layer and having an outer sidewall aligned with an outer sidewall of the molding compound.

16. The semiconductor package of claim 15, further comprising:
a thermal insulating material arranged between the thermally conductive layer and the heat sink.

17. The semiconductor package of claim 15, wherein the thermally conductive layer is arranged along outer sidewalls of the at least one chip.

18. The semiconductor package of claim 15, wherein the at least one chip includes a first chip having a first chip height and a second chip having a second chip height different than the first chip height, wherein the first and second chip heights are measured perpendicular to the upper surface of the wafer.

19. The semiconductor package of claim 18, wherein the thermally conductive layer extends over and between the first and second chips, and wherein the substantially planar upper surface extends over the entirety of the upper surface of the wafer.

20. The semiconductor package of claim 18, wherein the first chip is spaced apart from the second chip by the second portion of the upper surface of the adhesive layer.

* * * * *